US010141782B2

(12) United States Patent
Van Wageningen

(10) Patent No.: US 10,141,782 B2
(45) Date of Patent: Nov. 27, 2018

(54) WIRELESS INDUCTIVE POWER TRANSFER

(71) Applicant: KONINKLIJKE PHILIPS N.V., Eindhoven (NL)

(72) Inventor: Andries Van Wageningen, Wijlre (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/633,796

(22) Filed: Jun. 27, 2017

(65) Prior Publication Data

US 2017/0294806 A1    Oct. 12, 2017

Related U.S. Application Data

(63) Continuation of application No. 14/435,177, filed as application No. PCT/IB2013/058517 on Sep. 13, 2013, now Pat. No. 9,716,388.

(30) Foreign Application Priority Data

Oct. 16, 2012 (EP) .................................. 12188672

(51) Int. Cl.
*H01F 27/42*    (2006.01)
*H01F 3/00*    (2006.01)
(Continued)

(52) U.S. Cl.
CPC .............. *H02J 50/10* (2016.02); *G01R 21/06* (2013.01); *H02J 5/005* (2013.01); *H02J 7/025* (2013.01);
(Continued)

(58) Field of Classification Search
USPC .................................. 307/104; 361/139–141
See application file for complete search history.

(56) References Cited

U.S. PATENT DOCUMENTS 9,092,039 B2 *   7/2015   Fadell .................... F24F 11/30
9,160,196 B2 *  10/2015   Endo ....................... H02J 5/005
(Continued)

FOREIGN PATENT DOCUMENTS

EP        2375532 A2   10/2011
EP        2490342 A2    8/2012
WO    WO2005109597 A1  11/2005

OTHER PUBLICATIONS

Kuyvenhoven N. et al., "Development of a Foreign Object Detection and Analysis Method for Wireless Power Systems", 2011 IEEE Symposium on Product Compliance Engineering (ISPCE), Product Safety Engineering Society (PSES), San Diego, CA, pp. 1-6.
(Continued)

*Primary Examiner* — Adam Houston
(74) *Attorney, Agent, or Firm* — Larry Liberchuk

(57) ABSTRACT

A power transmitter transfers power to a power receiver using a wireless power signal. The power transmitter comprises an inductor driven by a power signal generator to provide the power signal. A calibration controller determines whether a power loss calibration has been performed for the power transmitter and power receiver pairing. The calibration adapts an expected relationship between a received power indication provided by the power receiver and a transmitted power indication for the power transmitter. A power limiter restricts the power provided to the inductor to not exceed a threshold unless a power loss calibration has been performed for the pairing. The expected relationship may be used to detect unaccounted for power losses, e.g. due to foreign objects being present. The calibrated expected relationship may provide improved accuracy allowing accurate detection at higher power levels. At lower power levels such accuracy is not needed, and no calibration needs to be performed.

15 Claims, 5 Drawing Sheets

(51) Int. Cl.
*H01F 38/00* (2006.01)
*H02J 50/10* (2016.01)
*H02J 50/80* (2016.01)
*H02J 50/60* (2016.01)
*H02J 7/02* (2016.01)
*H02J 5/00* (2016.01)
*G01R 21/06* (2006.01)
*H02J 17/00* (2006.01)
*H02J 7/04* (2006.01)

(52) U.S. Cl.
CPC .............. *H02J 7/045* (2013.01); *H02J 17/00* (2013.01); *H02J 50/60* (2016.02); *H02J 50/80* (2016.02)

(56) References Cited

U.S. PATENT DOCUMENTS

| | | | | |
|---|---|---|---|---|
| 9,425,864 B2* | 8/2016 | Staring | | H02J 5/005 |
| 9,450,648 B2* | 9/2016 | Bastami | | H02J 5/005 |
| 9,479,005 B2* | 10/2016 | Jung | | H02J 7/025 |
| 9,479,013 B2* | 10/2016 | Joye | | H02J 5/005 |
| 9,509,171 B2* | 11/2016 | Lundgren | | H02J 50/80 |
| 9,558,883 B2* | 1/2017 | Byun | | H01F 38/14 |
| 9,577,474 B2* | 2/2017 | Watanabe | | H02J 17/00 |
| 9,583,256 B2* | 2/2017 | Lapetina | | H01F 27/365 |
| 9,777,715 B2* | 10/2017 | Laifenfeld | | F03G 7/065 |
| 2009/0010028 A1* | 1/2009 | Baarman | | H02J 50/12 363/25 |
| 2010/0084918 A1* | 4/2010 | Fells | | H02J 5/005 307/32 |
| 2011/0196544 A1* | 8/2011 | Baarman | | H02J 5/005 700/291 |
| 2015/0177293 A1* | 6/2015 | McFarthing | | G01R 21/06 340/870.3 |
| 2015/0263532 A1* | 9/2015 | Van Wageningen | | H02J 5/005 307/104 |
| 2016/0149440 A1* | 5/2016 | Staring | | H02J 50/10 307/104 |
| 2016/0181818 A1* | 6/2016 | Joye | | H02J 5/005 307/104 |
| 2017/0018977 A1* | 1/2017 | Van Wageningen | | H02J 5/005 |
| 2018/0062437 A1* | 3/2018 | Singh | | H02J 50/10 |
| 2018/0062704 A1* | 3/2018 | Singh | | H04B 5/005 |
| 2018/0115197 A1* | 4/2018 | Li | | H02J 50/12 |
| 2018/0191200 A1* | 7/2018 | Dibben | | H02J 7/025 |

OTHER PUBLICATIONS

"System Description Wireless Power Transfer vol. I: Low Power Part 1: Interface Definition Version 1.1", Wireless Power Consortium, Mar. 2012.

FOD (Foreign Object Detection), Quality assurance for Optical Media and Wireless Power Transfer—AudioDev, http://www.audiodev.com/?id=9621 Jul. 6, 2012.

* cited by examiner

WIRELESS INDUCTIVE POWER TRANSFER

FIELD OF THE INVENTION

The invention relates to inductive power transfer and in particular, but not exclusively, to an inductive power transfer system in accordance with the Qi wireless power transfer standard.

BACKGROUND OF THE INVENTION

The number and variety of portable and mobile devices in use have exploded in the last decade. For example, the use of mobile phones, tablets, media players etc. has become ubiquitous. Such devices are generally powered by internal batteries and the typical use scenario often requires recharging of batteries or direct wired powering of the device from an external power supply.

Most present day systems require a wiring and/or explicit electrical contacts to be powered from an external power supply. However, this tends to be impractical and requires the user to physically insert connectors or otherwise establish a physical electrical contact. It also tends to be inconvenient to the user by introducing lengths of wire. Typically, power requirements also differ significantly, and currently most devices are provided with their own dedicated power supply resulting in a typical user having a large number of different power supplies with each being dedicated to a specific device. Although, the use of internal batteries may avoid the need for a wired connection to a power supply during use, this only provides a partial solution as the batteries will need recharging (or replacing which is expensive). The use of batteries may also add substantially to the weight and potentially cost and size of the devices.

In order to provide a significantly improved user experience, it has been proposed to use a wireless power supply wherein power is inductively transferred from a transmitter coil in a power transmitter device to a receiver coil in the individual devices.

Power transmission via magnetic induction is a well-known concept, mostly applied in transformers, having a tight coupling between primary transmitter coil and a secondary receiver coil. By separating the primary transmitter coil and the secondary receiver coil between two devices, wireless power transfer between these becomes possible based on the principle of a loosely coupled transformer.

Such an arrangement allows a wireless power transfer to the device without requiring any wires or physical electrical connections to be made. Indeed, it may simply allow a device to be placed adjacent to or on top of the transmitter coil in order to be recharged or powered externally. For example, power transmitter devices may be arranged with a horizontal surface on which a device can simply be placed in order to be powered.

Furthermore, such wireless power transfer arrangements may advantageously be designed such that the power transmitter device can be used with a range of power receiver devices. In particular, a wireless power transfer standard known as the Qi standard has been defined and is currently being developed further. This standard allows power transmitter devices that meet the Qi standard to be used with power receiver devices that also meet the Qi standard without these having to be from the same manufacturer or having to be dedicated to each other. The Qi standard further includes some functionality for allowing the operation to be adapted to the specific power receiver device (e.g. dependent on the specific power drain).

The Qi standard is developed by the Wireless Power Consortium and more information can e.g. be found on their website: http://www.wirelesspowerconsortium.com/index.html, where in particular the defined Standards documents can be found.

The Qi wireless power standard describes that a power transmitter must be able to provide a guaranteed power to the power receiver. The specific power level needed depends on the design of the power receiver. In order to specify the guaranteed power, a set of test power receivers and load conditions are defined which describe the guaranteed power level for each of the conditions.

Qi originally defined a wireless power transfer for low power devices considered to be devices having a power drain of less than 5 W. Systems that fall within the scope of this standard use inductive coupling between two planar coils to transfer power from the power transmitter to the power receiver. The distance between the two coils is typically 5 mm. It is possible to extend that range to at least 40 mm.

However, work is ongoing to increase the available power, and in particular the standard is being extended to mid-power devices being devices having a power drain of more than 5 W.

The Qi standard defines a variety of technical requirements, parameters and operating procedures that a compatible device must meet.

Communication

The Qi standard supports communication from the power receiver to the power transmitter thereby enabling the power receiver to provide information that may allow the power transmitter to adapt to the specific power receiver. In the current standard, a unidirectional communication link from the power receiver to the power transmitter has been defined and the approach is based on a philosophy of the power receiver being the controlling element. To prepare and control the power transfer between the power transmitter and the power receiver, the power receiver specifically communicates information to the power transmitter.

The unidirectional communication is achieved by the power receiver performing load modulation wherein a loading applied to the secondary receiver coil by the power receiver is varied to provide a modulation of the power signal. The resulting changes in the electrical characteristics (e.g. variations in the current draw) can be detected and decoded (demodulated) by the power transmitter.

Thus, at the physical layer, the communication channel from power receiver to the power transmitter uses the power signal as a data carrier. The power receiver modulates a load which is detected by a change in the amplitude and/or phase of the transmitter coil current or voltage. The data is formatted in bytes and packets.

More information can be found in chapter 6 of part 1 the Qi wireless power specification (version 1.0).

Although Qi uses a unidirectional communication link, it has been proposed to introduce communication from the power transmitter to the power receiver. However, such a bidirectional link is not trivial to include and is subject to a large number of difficulties and challenges. For example, the resulting system still needs to be backwards compatible and e.g. power transmitters and receivers that are not capable of bidirectional communication still need to be supported. Furthermore, the technical restrictions in terms of e.g. modulation options, power variations, transmission options etc. are very restrictive as they need to fit in with the existing parameters. It is also important that cost and complexity is kept low, and e.g. it is desirable that the requirement for additional hardware is minimized, that detection is easy and reliable, etc. It is also important that the communication from the power transmitter to the power receiver does not impact, degrade or interfere with the communication from the power receiver to the power transmitter. Furthermore, an all-important requirement is that the communication link does not unacceptably degrade the power transfer ability of the system.

Accordingly, many challenges and difficulties are associated with enhancing a power transfer system such as Qi to include bidirectional communication.

System Control

In order to control the wireless power transfer system, the Qi standard specifies a number of phases or modes that the system may be in at different times of the operation. More details can be found in chapter 5 of part 1 the Qi wireless power specification (version 1.0).

The system may be in the following phases:

Selection Phase

This phase is the typical phase when the system is not used, i.e. when there is no coupling between a power transmitter and a power receiver (i.e. no power receiver is positioned close to the power transmitter).

In the selection phase, the power transmitter may be in a stand-by mode but will sense in order to detect a possible presence of an object. Similarly, the receiver will wait for the presence of a power signal.

Ping Phase:

If the transmitter detects the possible presence of an object, e.g. due to a capacitance change, the system proceeds to the ping phase in which the power transmitter (at least intermittently) provides a power signal. This power signal is detected by the power receiver which proceeds to send an initial package to the power transmitter. Specifically, if a power receiver is present on the interface of the power transmitter, the power receiver communicates an initial signal strength packet to the power transmitter. The signal strength packet provides an indication of the degree of coupling between the power transmitter coil and the power receiver coil. The signal strength packet is detected by the power transmitter.

Identification & Configuration Phase:

The power transmitter and power receiver then proceeds to the identification and configuration phase wherein the power receiver communicates at least an identifier and a required power. The information is communicated in multiple data packets by load modulation. The power transmitter maintains a constant power signal during the identification and configuration phase in order to allow the load modulation to be detected. Specifically, the power transmitter provides a power signal with constant amplitude, frequency and phase for this purpose (except from the change caused by load-modulation).

In preparation of the actual power transfer, the power receiver can apply the received signal to power up its electronics but it keeps its output load disconnected. The power receiver communicates packets to the power transmitter. These packets include mandatory messages, such as the identification and configuration packet, or may include some defined optional messages, such as an extended identification packet or power hold-off packet.

The power transmitter proceeds to configure the power signal in accordance with the information received from the power receiver.

Power Transfer Phase:

The system then proceeds to the power transfer phase in which the power transmitter provides the required power signal and the power receiver connects the output load to supply it with the received power.

During this phase, the power receiver monitors the output load conditions, and specifically it measures the control error between the actual value and the desired value of a certain operating point. It communicates these control errors in control error messages to the power transmitter with a minimum rate of e.g. every 250 msec. This provides an indication of the continued presence of the power receiver to the power transmitter. In addition the control error messages are used to implement a closed loop power control where the power transmitter adapts the power signal to minimize the reported error. Specifically, if the actual value of the operating point equals the desired value, the power receiver communicates a control error with a value of zero resulting in no change in the power signal. In case the power receiver communicates a control error different from zero, the power transmitter will adjust the power signal accordingly.

A potential problem with wireless power transfer is that power may unintentionally be transferred to e.g. metallic objects. For example, if a foreign object, such as e.g. a coin, key, ring etc., is placed upon the power transmitter platform arranged to receive a power receiver, the magnetic flux generated by the transmitter coil will introduce eddy currents in the metal objects which will cause the objects to heat up. The heat increase may be very significant and may indeed result in a risk of pain and damage to humans subsequently picking up the objects.

Experiments have shown that metal objects positioned at the surface of a power transmitter can reach an undesired high temperature (higher than 60° C.) at normal environment temperatures (20° C.) even for power dissipation in the object being as low as 500 mW. For comparison, skin burning caused by contact with hot objects starts at temperatures of around 65° C.

In order to prevent such scenarios, it has been proposed to introduce foreign object detection where the power transmitter can detect the presence of a foreign object and reduce the transmit power and/or generate a user alert when a positive detection occurs. For example, the Qi system includes functionality for detecting a foreign object, and for reducing power if a foreign object is detected.

The power dissipation in a foreign object can be estimated from the difference between transmitted and received power. In order to prevent that too much power is dissipated in a foreign object, the transmitter can terminate the power transfer if the power loss exceeds a threshold.

In the Qi power transfer standard, the power receiver estimates its received power e.g. by measuring the rectified voltage and current, multiplying them and adding an estimate of the internal power losses in the power receiver (e.g. losses of the rectifier, the receive coil, metal parts being part of the receiver etc.). The power receiver reports the determined received power to the power transmitter with a minimum rate of e.g. every four seconds.

The power transmitter estimates its transmitted power, e.g. by measuring the DC input voltage and current of the inverter, multiplying them and correcting the result by subtracting an estimation of the internal power losses in the transmitter, such as e.g. estimated power loss in the inverter, the primary coil and metal parts that are part of the power transmitter.

The power transmitter can estimate the power loss by subtracting the reported received power from the transmitted power. If the difference exceeds a threshold, the transmitter will assume that too much power is dissipated in a foreign object and it can then proceed to terminate the power transfer.

Specifically, the power transfer is terminated when the estimated power loss PT-PR is larger than a threshold where PT is the estimated transmitted power and PR is the estimated received power.

The measurements may be synchronized between the power receiver and the power transmitter. In order to achieve this, the power receiver can communicate the parameters of a time-window to the power transmitter during configuration. This time window indicates the period in which the power receiver determines the average of the received power. The time window is defined relative to a reference time which is the time when the first bit of a received power packet is communicated from power receiver to power transmitter. The configuration parameters for this time window consist of a duration of the window and a start time relative to the reference time.

When performing this power loss detection, it is important that the power loss is determined with sufficient accuracy to ensure that the presence of a foreign object is detected. Firstly, it must be ensured that a foreign object which absorbs significant power from the magnetic field is detected. In order to ensure this, any error in estimating the power loss calculated from the transmitted and received power must be less than the acceptable level for power absorption in a foreign object. Similarly, in order to avoid false detections, the accuracy of the power loss calculation must be sufficiently accurate to not result in estimated power loss values that are too high when no foreign object is present.

It is substantially more difficult to determine the transmitted and received power estimates sufficiently accurately at higher power levels than for lower power levels. For example, assuming that an uncertainty of the estimates of the transmitted and received power is ±3%, this can lead to an error of ±150 mW at 5 W transmitted and received power, and
±1.5 W at 50 W transmitted and received power.

Thus, whereas such accuracy may be acceptable for a low power transfer operation it is not acceptable for a high power transfer operation.

Typically, it is required that the power transmitter must be able to detect power consumption of foreign objects of only 350 mW or even lower. This requires very accurate estimation of the received power and the transmitted power. This is particularly difficult at high power levels, and frequently it is difficult for power receivers to generate estimates that are sufficiently accurate. However, if the power receiver overestimates the received power, this can result in power consumption by foreign objects not being detected. Conversely, if the power receiver underestimates the received power, this may lead to false detections where the power transmitter terminates the power transfer despite no foreign objects being present.

US2011/0196544 discloses that detection of foreign objects can be based on evaluating whether a measured primary current for the power transmitter inductor differs from an expected primary current. The expected primary current is determined based on the voltage and currents of the power receiver measured after rectification. The exact coefficients are determined by curve fitting using data collected using external current and voltage readings. However, although the approach may allow detection of foreign objects, it tends to require cumbersome processes in order to determine the expected relationships. Although this determination may be performed e.g. during manufacturing, such an approach will only allow the expected relationship for generic receivers to be determined. As there will typically be a large degree of variation between different power receivers, this will typically render the approach unfeasible or impractical at higher power levels.

WO2005/109597 discloses a power transfer system wherein the power transmitter may operate in different modes and in particular may automatically switch the power transmitter into a shutdown mode if a total parasitic load exceeds a given threshold. However, in order to detect the total parasitic load, the system enters dedicated measurement modes wherein the power transfer is effectively terminated by the load of the power receiver being disconnected. Thus, power transfer is interupted and cannot be performed during the measurement phase. In order to differentiate between different loads of the power transmitter, WO2005/109597 discloses that specific measurement modes must be entered wherein some of the loads can be disconnected. However, such an approach is not only complex and cumbersome but also results in intermittent power transfer. Furthermore, the system is inherently relatively inaccurate and therefore not suitable for higher power transfers. The system includes calibration only for the power transmitter, and the same approach is applied regardless of e.g. power consumption and whether accurate power calibration is possible.

EP 2 490 342 A2 discloses a wireless power transfer system wherein a power transmission device and a power reception device which exchanges power capability information prior to a power transfer.

An improved power transfer system would be advantageous. In particular, an approach that allows improved operation while maintaining a user friendly approach would be advantageous. In particular, an approach that allows easier user operation while ensuring safe operation, especially at higher power levels, would be advantageous. An improved power transfer system allowing increased flexibility, facilitated implementation, facilitated operation, safer operation, reduced risk of foreign object heating, increased accuracy and/or improved performance would be advantageous.

SUMMARY OF THE INVENTION

Accordingly, the Invention seeks to preferably mitigate, alleviate or eliminate one or more of the above mentioned disadvantages singly or in any combination.

According to an aspect of the invention there is provided a power transmitter for transferring power to a power receiver using a wireless inductive power signal, the power transmitter comprising: an inductor for providing the power signal; a power signal generator for driving the inductor to provide the power signal; a calibration controller for determining whether a power loss calibration has been performed for the power transmitter and power receiver pairing, the power loss calibration determining an expected relationship between a received power indication provided by the power receiver and a transmitted power indication for the power transmitter; a power limiter arranged to restrict a power provided to the inductor to not exceed a threshold unless a power loss calibration has been performed for the power transmitter and power receiver pairing; a receiver for receiving received power indications from the power receiver; and a detector for detecting a parasitic power consumption in response to a deviation between a relationship between the transmitted power indication and the received power indication and the expected relationship between the transmitted power indication and the received power indication exceeding a threshold.

The invention may allow safer operation for a power transfer system. The approach may allow improved safety at higher power levels while allowing low complexity and facilitated operation at lower power levels. In particular, higher power levels may be restricted to pairings of power transmitters and power receivers that have already been calibrated such that improved accuracy can be achieved when estimating e.g. any parasitic power loss, e.g. associated with foreign objects. Safer operating at higher power levels can be combined with low complexity, and in particular calibration free performance, at lower levels. Thus, an improved combination of simplicity and safety of operation can be achieved.

The invention may allow improved unaccounted for power detection. It may typically allow improved foreign object detection and may in particular in many embodiments ensure that the power dissipated in foreign objects is kept to safe levels. This may be achieved even for higher power levels.

The expected relationship relates a received power indication to a transmitted power indication. For example, the expected relationship may provide an expected received power indication for a given transmitted power indication, or may e.g. provide an expected transmitted power indication for a given received power indication. In the former case, the deviation may be determined as a difference between the actual received power indication and the expected received power indication. In the latter case, the deviation may be determined as a difference between the actual transmitted power indication and the expected transmitted power indication.

The expected relationship may be a function which as an input has a transmitted power indication and as an output has a received power indication. The function can thus reflect the received power indication that is expected for a given transmitted power indication. Thus, the function can be used to estimate the received power indication that should be received during normal operation. If an actual received power indication matches the expected received power indication (in accordance with a suitable match criterion), then this can be used as an indication that no unusual operating conditions currently occur, and specifically it can be estimated that there are no (significant) parasitic power losses. However, if the actual received power indication does not match the expected received power indication, then this can be used as an indication that unusual operation conditions exist, and specifically that significant parasitic power losses may be present.

Similarly, the expected relationship may be a function which as an input has a received power indication and as an output has a transmitted power indication. The function can thus reflect the transmitted power indication that is expected for a given received power indication. Thus, the function can be used to estimate the transmitted power indication that should be measured when a given received power indication is received during normal operation. If an actual measured transmitted power indication matches the expected transmitted power indication (in accordance with a suitable match criterion), then this can be used as an indication that no unusual operating conditions currently occur, and specifically it can be estimated that there are no (significant) parasitic power losses. However, if the actual transmitted power indication does not match the expected transmitted power indication, then this can be used as an indication that unusual operation conditions exist, and specifically that significant parasitic power losses may be present.

The determining of the expected relationship may specifically correspond to, or include, an adaptation of an expected relationship. For example, a standard and generic expected relationship may be provided and this may be adjusted to the specific current conditions measured for the specific power transmitter and specific power receiver. Furthermore, the adaptation may be continuous and e.g. include a continuous adaptation and adjustment to the current conditions. Thus, the adaptation may e.g. cause the expected relationship to be adjusted to reflect the changes due to e.g. temperature variations, component tolerances and variations, power transmitter and/or power receiver characteristics etc.

The deviation may be calculated for a single value of one of the received power indication or the transmitted power indication, such as e.g. a current value of one of the indications.

The power loss calibration may compare reported received power indications provided by the power receiver to transmitted power indications calculated for the power transmitter.

In some embodiments, the transmitted power indication may be one or more values that may be used to calculate transmit power, such as for example an inductor current, inductor voltage, a phase difference between inductor voltage and current, a coil drive (e.g. inverter) input current or a coil drive (e.g. inverter) input voltage.

A compensation value may be determined to reflect the difference between the received power indication(s) and the transmitted power indication(s). The compensation value may be a composite value comprising a plurality of values. For example, the compensation value may be a set of values for different power levels. In some embodiments, each element of the compensation value may be a scalar value (or set of scalar values). In some embodiments, each element of the compensation value may be a function, such as e.g. a function relating the received power indications to expected power transmit indications, or relating the expected power transmit indications to the received power indications. The expected relationship may thus be indicated by a compensation value or a set of compensation values.

The power being restricted by the power limiter may for example be a complex power at the inductor including both the real (dissipated) power and the reactive power, e.g. it may be the apparent power. In some embodiments, the power being restricted may be the real (transmitted) power only.

The power limiter may be arranged to reduce the apparent power of the inductor. Specifically, the power limiter may restrict the apparent power given as the product of the RMS voltage and RMS current at the inductor.

The power limiter may specifically be arranged to reduce the inductor current to not exceed a threshold unless a power loss calibration has been performed for the power transmitter and power receiver pairing. This may be particularly attractive in cases where the inductor voltage is kept substantially constant.

Restricting the power by restricting the apparent power, such as by restricting the inductor current, may be advantageous in many embodiments. Specifically by limiting the current it is possible to directly limit the magnetic potential and the induced voltage. A low voltage is intrinsically safer than a high voltage.

The power limiter may also restrict the power provided to the inverter and as a consequence restrict the power to the inductor.

The threshold may be a static, fixed threshold. For example, the threshold (for restricting the power to the inductor) may correspond to an inductor current of 1 A, 2 A, etc., to an apparent power of 10VA, 20VA, etc, or to a transmitted power level of 1 W, 2 W, 5 W, 1.0 W or 20 W. In some embodiments, the power transmitter may be arranged to set the threshold in response to a characteristic of the power receiver.

The received power indication may for example be a received power estimate generated by the power receiver, or may e.g. be provided as a current and/or voltage value. The received power indication may include a power consumption of a load as well as possibly power consumption due to losses in the power receiver. The transmitted power indication may be indicative of an input power for the power transmitter and/or to the power signal generator. Specifically, the power signal generator may comprise an inverter driving the inductor and the transmitted power signal may be indicative of the input power to the inverter. In some embodiments, the transmitted power indication may reflect the power fed to the inductor. In some embodiments, the transmitted power indication may be a current and/or voltage indication.

In some embodiments, the detector may be arranged to determine the deviation between the relationship between the transmitted power indication and the received power indication and the expected relationship by comparing an expected transmit power indication to a current transmit power indication. The current transmit power indication may e.g. be a measured transmit power, e.g. calculated from measurements of inductor current, inductor voltage etc. The expected transmit power indication may be generated by applying an expected relationship (or function) to a received power indication. The deviation may be considered to exceed the threshold if the difference between the expected transmit power and the current transmit power exceeds a threshold.

In some embodiments, the detector may be arranged to determine the deviation between the relationship between the transmitted power indication and the received power indication and the expected relationship by comparing an expected receive power indication to a current received power indication. A current transmit power indication may be generated as a measured transmit power, e.g. calculated from measurements of inductor current, inductor voltage etc. The expected received power indication may be generated by applying an expected relationship (or function) to the current transmit power indication. The deviation may be considered to exceed the threshold if the difference between the expected received power indication and the received power indication exceeds a threshold.

A foreign object may be an object which is not a power receiver arranged to receive power by a wireless power transfer from the power transmitter.

In accordance with an optional feature of the invention, the power transmitter further comprises: a calibrator for performing a power loss calibration to determine the expected relationship during a calibration phase, the expected relationship being determined by a comparison of at least one transmitted power indication and at least one received power indication during the calibration phase.

The invention may allow improved unaccounted for power detection. It may typically allow improved foreign object detection and may in particular in many embodiments ensure that the power dissipated in foreign objects is kept to safe levels. This may be achieved even for higher power levels.

The improved operation may be provided by a calibration process. The calibration based on the received power indications and transmitted power indications provides a calibration of the specific pairing between the power transmitter and the power receiver. Thus, rather than using a generic calibration for a generic receiver, the calibration is directly for the individual power receiver being part of the power transfer. As such, an increased accuracy can be achieved thereby allowing e.g. safer operation at higher power levels.

In accordance with an optional feature of the invention, the calibrator is arranged to request a user input, and to only perform the power loss calibration when the user input is received.

This may provide an improved accuracy of the calibration. In particular, it may ensure that calibration can be performed while assuming that no foreign objects are present, thereby allowing an improved detection of differences resulting from foreign objects.

In accordance with an optional feature of the invention, the calibrator is arranged to perform the lower loss calibration by initially determining a first expected relationship at a first power level and then determining a second expected relationship at a second power level using the first expected relationship, the second power level being higher than the first power level.

Such an approach may ensure safe operation even during the calibration process. In particular, it may allow improved foreign object detection throughout the entire calibration process, and specifically at higher power levels.

In accordance with an optional feature of the invention, the calibrator is arranged to, when determining the second power level, restrict the power provided to the inductor in response to a detection that a relationship between the transmitted power indication and the received power indication differs from the expected relationship between transmitted power indication and the received power indication.

Such an approach may ensure safe operation even during the calibration process and may specifically protect against unacceptable heating of foreign objects during the entire calibration process. In many embodiments, the power provided to the inductor is restricted to the same level as during the power transfer phase.

In accordance with an optional feature of the invention, the power transmitter further comprises an expected relationship adaptor arranged to adapt the expected relationship during a power transfer phase, the expected relationship being adapted in response to a comparison of at least one transmitted power indication and at least one received power indication during the power transfer phase.

This may allow an improved accuracy. In particular, the power transfer phase is typically much longer than any calibration phase, and accordingly more measurements/sample points may be available to provide a more accurate expected relationship.

In accordance with an optional feature of the invention, an adaptation rate for adapting the expected relationship during the power transfer phase is lower than an adaptation rate for determining the expected relationship during the calibration phase.

This may provide improved accuracy while allowing relatively short calibration procedures. The time constant for the power transfer phase may typically at least 2, 5 or 10 times higher than the time constant for the calibration phase.

In accordance with an optional feature of the invention, the expected relationship adaptor is arranged not to adapt the expected relationship in response to transmitted power indications and received power indications in response to a detection that a deviation between the relationship between the transmitted power indication and the received power indication and the expected relationship between transmitted power indication and the received power indication exceeds a threshold.

This may ensure more reliable operation, and may specifically reduce the risk of the presence of a foreign object resulting in an adaptation of the expected relationship.

In accordance with an optional feature of the invention, the power transmitter further comprises: a memory for storing identities and expected relationship data for power receivers; a receiver for receiving a first identity from the power receiver; and wherein the calibration controller is arranged to determine whether power loss calibration has been performed for the power transmitter and power receiver pairing in response to the first identity and the identities stored in the memory.

This may provide facilitated and/or improved operation. In many scenarios, it may reduce the number of calibrations that need to be performed. For example, it may in many embodiments allow for many power transfer sessions without the need for dedicated user input. It may in many embodiments allow a faster power transfer for power receivers that have previously been used with the power transmitter.

The calibration controller may determine that a power loss calibration has been performed if a compensation value is stored in the memory for the identity of the power receiver.

In accordance with an optional feature of the invention, the calibration controller is arranged to initiate a power loss calibration in response to a detection that no valid expected relationship data is stored for the first identity.

This may provide an improved user experience and may allow the calibration to be performed when needed, and typically when power receivers are used with the power transmitter for the first time.

The compensation values determined by the calibration process may be stored in the memory together with the power receiver identity.

In accordance with an optional feature of the invention, the calibration controller is arranged to skip a power loss calibration and to extract the expected relationship data for the identity of the power receiver from the memory if the identity of the power receiver matches one of the identities stored in the memory.

This may provide an improved user experience and may reduce the number of calibrations needed.

According to an aspect of the invention, there is provided a power transfer system comprising a power transmitter and a power receiver, the power transmitter being arranged to transfer power to a power receiver using a wireless inductive power signal, the power transmitter comprising: an inductor for providing the power signal; a power signal generator for driving the inductor to provide the power signal; the power transfer system further comprising: a calibration controller for determining whether a power loss calibration has been performed for the power transmitter and power receiver pairing, the power loss calibration determining an expected relationship between a received power indication provided by the power receiver and a transmitted power indication for the power transmitter; a power limiter arranged to restrict a power provided to the inductor to not exceed a threshold unless a power loss calibration has been performed for the power transmitter and power receiver pairing, a receiver for receiving received power indications from the power receiver; and a detector for detecting a parasitic power consumption in response to a deviation between a relationship between the transmitted power indication and the received power indication and the expected relationship between the transmitted power indication and the received power indication exceeding a threshold.

According to an aspect of the invention, there is provided a method of operation for a power transmitter arranged to transfer power to a power receiver using a wireless inductive power signal, the method comprising: driving an inductor to provide the power signal; determining whether a power loss calibration has been performed for the power transmitter and power receiver pairing, the power loss calibration determining an expected relationship between a received power indication provided by the power receiver and a transmitted power indication for the power transmitter; restricting a power provided to the inductor to not exceed a threshold unless a power loss calibration has been performed for the power transmitter and power receiver pairing; receiving received power indications from the power receiver; and detecting a parasitic power consumption in response to a deviation between a relationship between the transmitted power indication and the received power indication and the expected relationship between the transmitted power indication and the received power indication exceeding a threshold.

According to an aspect of the invention, there is provided power receiver for receiving power from a power transmitter via a wireless inductive power signal, the power receiver comprising: an inductor for receiving the power signal; a calibration controller for determining whether a power loss calibration has been performed for the power transmitter and power receiver pairing, the power loss calibration determining an expected relationship between a received power indication provided by the power receiver and a transmitted power indication for the power transmitter; a power limiter arranged to restrict a power requested from a power transmitter to not exceed a threshold unless a power loss calibration has been performed for the power transmitter and power receiver pairing; and a detector for detecting a parasitic power consumption in response to a deviation between a relationship between a transmitted power indication received from the power transmitter and a received power indication of the power receiver and the expected relationship between the transmitted power indication and the received power indication exceeding a threshold.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF SOME EMBODIMENTS OF THE INVENTION

Figure 1:
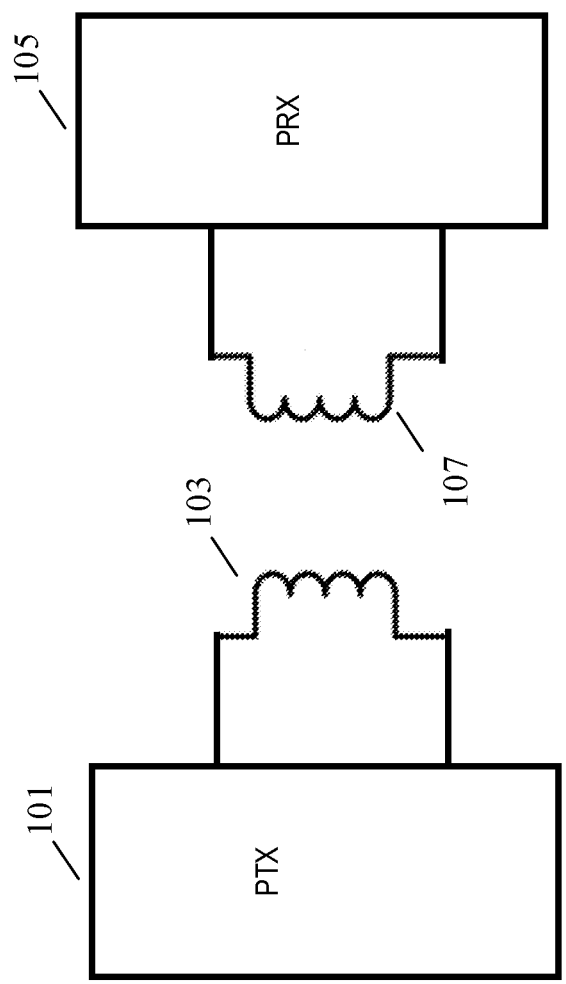
FIG. 1 illustrates an example of a power transfer system comprising a power transmitter and a power receiver in accordance with some embodiments of the invention.

FIG. 1 illustrates an example of a power transfer system in accordance with some embodiments of the invention. The power transfer system comprises a power transmitter 101 which includes (or is coupled to) a transmitter coil/inductor 103. The system further comprises a power receiver 105 which includes (or is coupled to) a receiver coil/inductor 107.

The system provides a wireless inductive power transfer from the power transmitter 101 to the power receiver 105. Specifically, the power transmitter 101 generates a power signal which is propagated as a magnetic flux by the transmitter coil 103. The power signal may typically have a frequency between around 100 kHz to 200 kHz. The transmitter coil 103 and the receiver coil 105 are loosely coupled and thus the receiver coil picks up (at least part of) the power signal from the power transmitter 101. Thus, the power is transferred from the power transmitter 101 to the power receiver 105 via a wireless inductive coupling from the transmitter coil 103 to the receiver coil 107. The term power signal is mainly used to refer to the inductive signal between the transmitter coil 103 and the receiver coil 107 (the magnetic flux signal), but it will be appreciated that by equivalence it may also be considered and used as a reference to the electrical signal provided to the transmitter coil 103, or indeed to the electrical signal of the receiver coil 107.

In the following, the operation of the power transmitter 101 and the power receiver 105 will be described with specific reference to an embodiment in accordance with the Qi standard (except for the herein described (or consequential) modifications and enhancements). In particular, the power transmitter 101 and the power receiver 103 may substantially be compatible with the Qi Specification version 1.0 or 1.1 (except for the herein described (or consequential) modifications and enhancements).

To prepare and control the power transfer between the power transmitter 101 and the power receiver 105 in the wireless power transfer system, the power receiver 105 communicates information to the power transmitter 101. Such communication has been standardized in the Qi Specification version 1.0 and 1.1.

On the physical level, the communication channel from the power receiver 105 to the power transmitter 101 is implemented by using the power signal as carrier. The power receiver 105 modulates the load of the receiver coil 105. This results in corresponding variations in the power signal at the power transmitter side. The load modulation may be detected by a change in the amplitude and/or phase of the transmitter coil 105 current, or alternatively or additional by a change in the voltage of the transmitter coil 105. Based on this principle, the power receiver 105 can modulate data which the power transmitter 101 demodulates. This data is formatted in bytes and packets. More information can be found in the "System description, Wireless Power Transfer, Volume I: Low Power, Part 1: Interface Definition, Version 1.0 July 2010, published by the Wireless Power Consortium" available via http://www.wirelesspowerconsortium.com/downloads/wireless-power-specification-part-1.html, also called the Qi wireless power specification, in particular chapter 6: Communications Interface.

To control the power transfer, the system may proceed via different phases, in particular a selection phase, a ping phase, identification and configuration phase, and a power transfer phase. More information can be found in chapter 5 of part 1 of the Qi wireless power specification.

Initially, the power transmitter 101 is in the selection phase wherein it merely monitors for the potential presence of a power receiver. The power transmitter 101 may use a variety of methods for this purpose, e.g. as described in the Qi wireless power specification. If such a potential presence is detected, the power transmitter 101 enters the ping phase wherein a power signal is temporarily generated. The power receiver 105 can apply the received signal to power up its electronics. After receiving the power signal, the power receiver 105 communicates an initial packet to the power transmitter 101. Specifically, a signal strength packet indicating the degree of coupling between power transmitter and power receiver is transmitted. More information can be found in chapter 6.3.1 of part 1 of the Qi wireless power specification. Thus, in the Ping phase it is determined whether a power receiver 105 is present at the interface of the power transmitter 101.

Upon receiving the signal strength message, the power transmitter 101 moves into the Identification & Configuration phase. In this phase, the power receiver 105 keeps its output load disconnected and communicates to the power transmitter 101 using load modulation. The power transmitter provides a power signal of constant amplitude, frequency and phase for this purpose (with the exception of the change caused by load-modulation). The messages are used by the power transmitter 101 to configure itself as requested by the power receiver 105.

Following the Identification and Configuration phase, the system moves on to the power transfer phase where the actual power transfer takes place. Specifically, after having communicated its power requirement, the power receiver 105 connects the output load and supplies it with the received power. The power receiver 105 monitors the output load and measures the control error between the actual value and the desired value of a certain operating point. It communicates such control errors to the power transmitter 101 at a minimum rate of e.g. every 250 ms to indicate these errors to the power transmitter 101 as well as the desire for a change, or no change, of the power signal.

Figure 2:
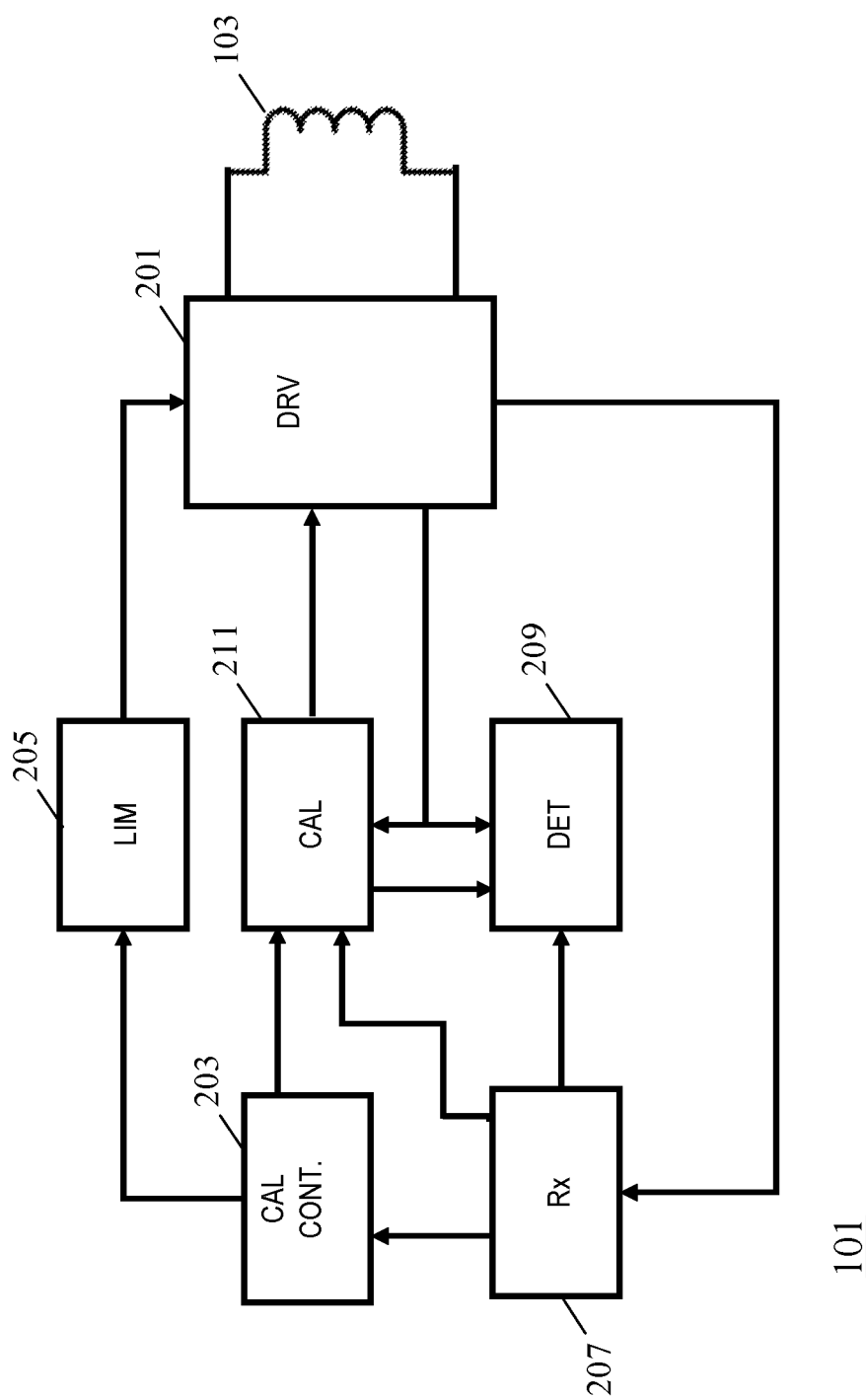
FIG. 2 illustrates an example of elements of a power transmitter in accordance with some embodiments of the invention.

FIG. 2 illustrates the power transmitter 101 in more detail.

Figure 3:
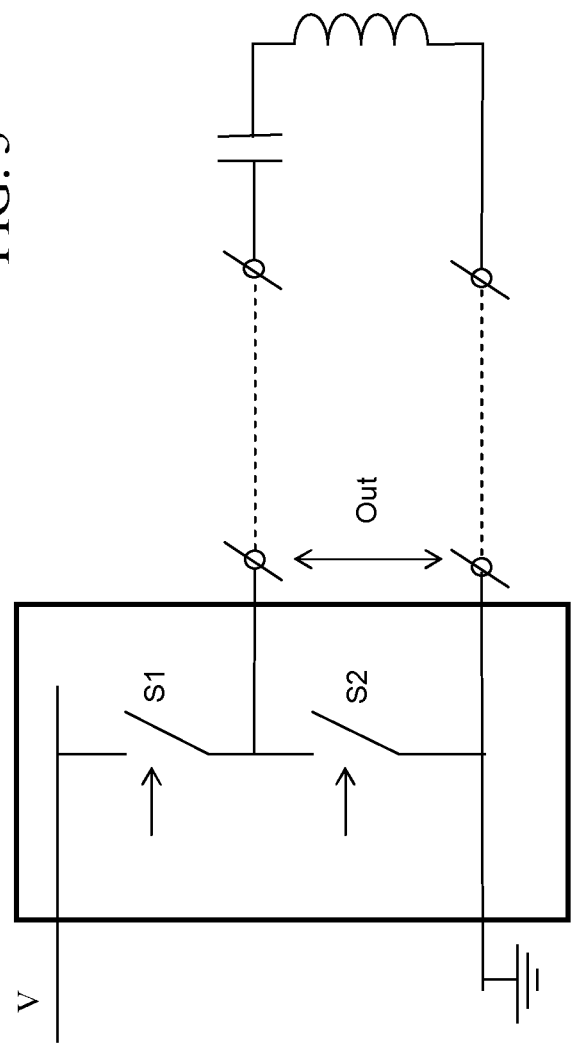
FIG. 3 illustrates an example of elements of a half-bridge inverter for a power transmitter in accordance with some embodiments of the invention.
Figure 4:
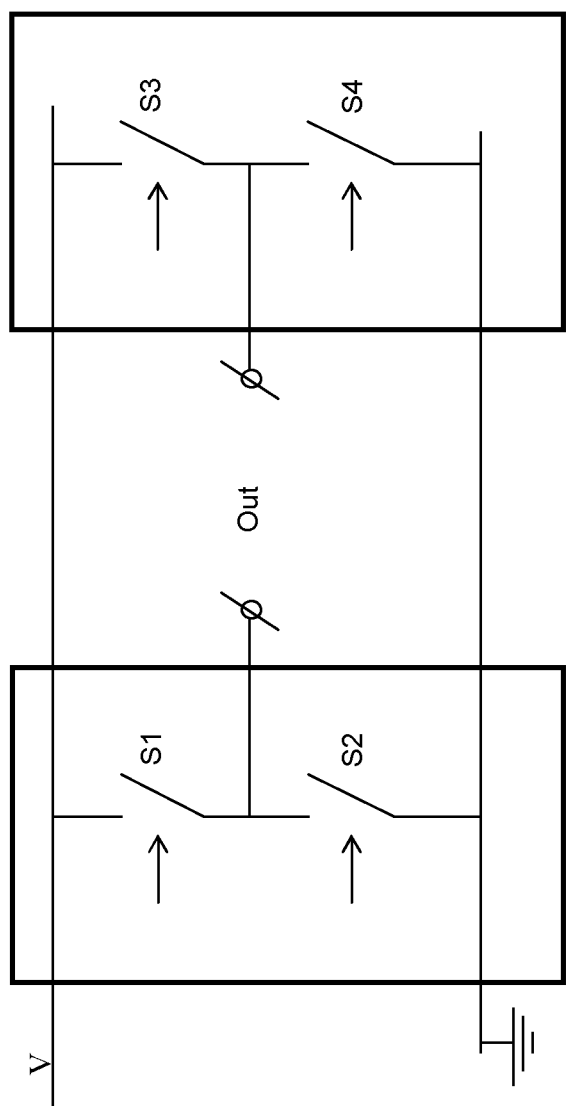
FIG. 4 illustrates an example of elements of a full-bridge inverter for a power transmitter in accordance with some embodiments of the invention.
Figure 5:
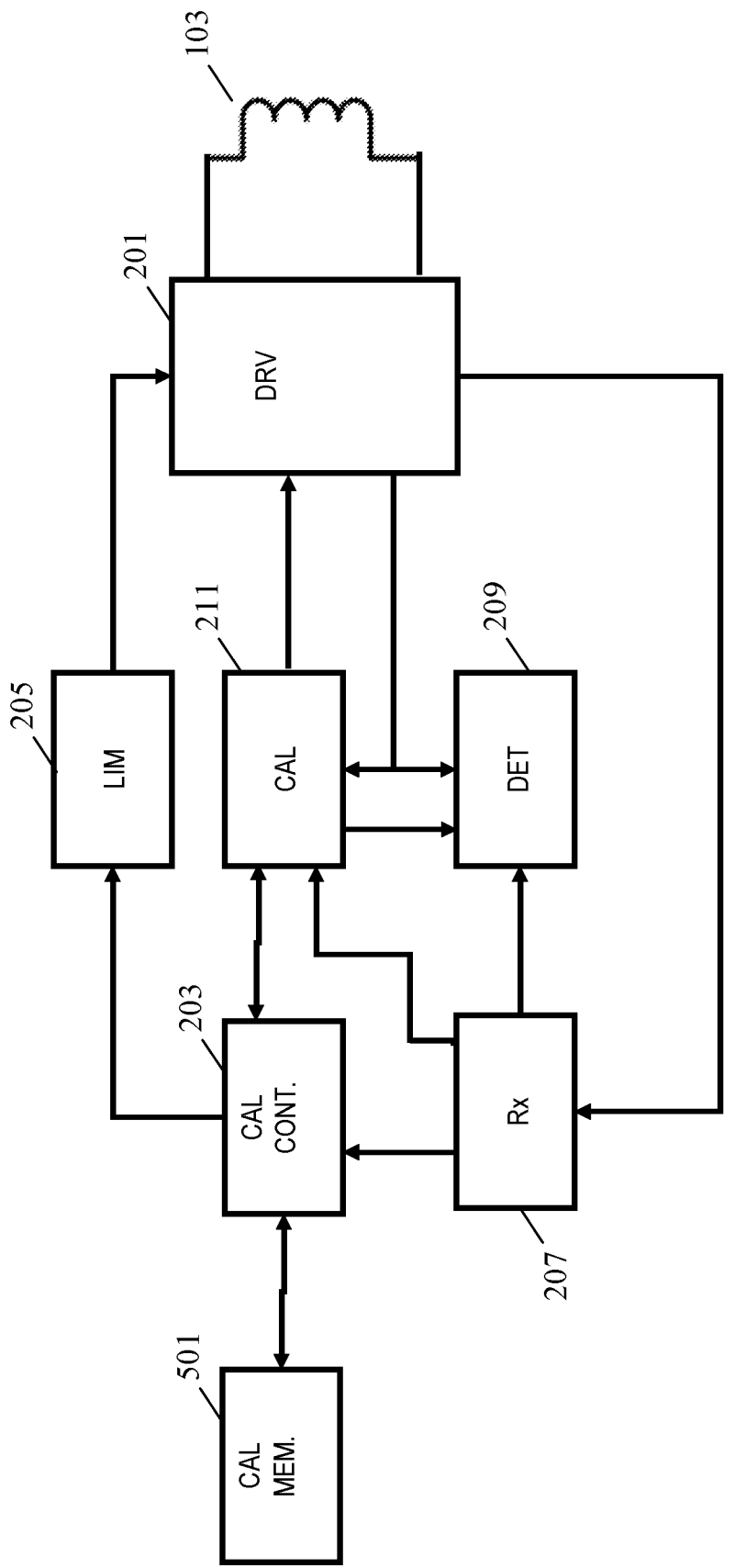
FIG. 5 illustrates an example of elements of a power transmitter in accordance with some embodiments of the invention.

The transmitter coil 103 is coupled to a power signal generator 201 which drives the inductor to provide the power signal. The power signal generator 201 thus generates the current and voltage which is fed to the transmitter coil 103. The power signal generator 201 is typically a drive circuit in the form of an inverter which generates an alternating signal from a DC Voltage. FIG. 3 shows a half-bridge inverter. The switches S1 and S2 are controlled such that they are never closed at the same time. Alternatingly S1 is closed while S2 is open and S2 is closed while S1 is open. The switches are opened and closed with the desired frequency, thereby generating an alternating signal at the output. Typically the output of the inverter is connected to the transmitter coil via a resonance capacitor. FIG. 4 shows a full-bridge inverter. The switches S1 and S2 are controlled such that they are never closed at the same time. The switches S3 and S4 are controlled such that they are never closed at the same time. Alternatingly switches S1 and S4 are closed while S2 and S3 are open, and then S2 and S3 are closed while S1 and S4 or open, thereby creating a block-wave signal at the output. The switches are open and closed with the desired frequency.

The power signal generator 201 also comprises control functionality for operating the power transfer function and may specifically comprise a controller arranged to operate the power transmitter 101 in accordance with the Qi standard. For example, the controller may be arranged to perform the Identification and Configuration as well as the power transfer phases of the Qi standard.

In addition, the power transmitter 101 comprises a calibration controller 203 which is arranged to determine whether a power loss calibration has been performed for the power transmitter and power receiver pairing.

The power loss calibration can provide one or more compensation values or functions for the expected relationship between indications of the received power which are provided by the receiver and indications of the power which is transmitted by the power transmitter 101.

Specifically, in power transfer systems such as the Qi standard, the power receiver 105 is required to communicate received power values to the power transmitter 101. The received power values are indicative of the power that is received by the power receiver 105.

In some embodiments, the power receiver 105 may report a received power value which corresponds directly to the power that is provided to the load of the power receiver 105. However, in many embodiments, the power receiver 105 will generate a received power value which also includes power loss/dissipation in the power receiver 105 itself. Thus the reported received power indication may include both power provided to the load as well as power loss in the power receiver 105 itself. For example, it may include measured or estimated power loss in the rectification circuits and/or the receiver coil.

In many embodiments, the received power indication may be provided directly as a power value. However, it will be appreciated that in other embodiments other indications may be provided, such as a current and/or voltage. For example, in some embodiments, the received power indication may be provided as the current or voltage induced in the receive coil 107.

The power transmitter 101 may furthermore calculate an estimate of the transmitted power. As a simple example, the transmitted power indication may be determined as the power which is fed to the transmitter coil 103 or may e.g. be determined as the input power to the inverter stage of the power signal generator 201. For example, the power transmitter 101 may measure the current through the transmitter coil, the voltage over the transmitter coil 103 and the phase difference between the voltage and current. It can then determine the corresponding (time averaged) power based on these values. As another example, the supply voltage of the inverter is typically constant, and the power transmitter 101 may measure the current drawn by the inverter and multiply this by the constant voltage to determine the input power to the inverter. This power may be used as the transmitter power indication. In some embodiments, one or more values that may be used to calculate a transmitted power may directly be used as a transmitter power indication. For example, a measured inverter input current may be compared to an expected inverter input current for a given received power indication (and possibly also dependent on other parameters). If the deviation exceeds a threshold, the parasitic power consumption may be considered too high.

In many embodiments, a slightly more complex transmitted power indication is generated. In particular, the approach may compensate the calculated power for losses in the power transmitter 101 itself. In particular, losses in the transmitter coil 103 itself may be calculated, and the input power may be compensated by this value to provide an improved indication of the power which is transmitted from the transmitter coil 103.

The power loss in the transmitter coil 103 may be calculated as:

$$P_{losscoil} = R \cdot I_{coil}^2$$

where $I_{coil}$ is the rms current through the transmitter coil 103 and R is the equivalent resistance of the transmitter coil 103. Assuming the resistance is known the transmitted power may be estimated by:

$$P_{tx} = V_{coil} \cdot I_{coil} \cdot \cos(\phi) - R \cdot I_{coil}^2$$

where $V_{coil}$ is the voltage over the transmitter coil 103 and $\phi$ is the phase between $V_{coil}$ and $I_{coil}$.

R may depend on the frequency of the transmitter coil current, e.g. according to a function such as: $R = R_b + R_f \cdot f$, where $R_b$ is the frequency independent part of the equivalent resistance, $R_f$ is the frequency dependent part of the equivalent resistance, and f is the frequency.

Typically time averaged values are used, e.g. with the power values being determined as average values in suitable time intervals, with the time intervals preferably being synchronized between the power transmitter 101 and the power receiver 105.

The received and transmitted power indications may be compared. In case the indications are provided directly as power levels, the power levels may be compared to each other. In an ideal system there are no losses incurred anywhere and the transmitted power will be identical to the received power. However, in practical systems, various losses will occur including losses in the power transmitter 101, in the power receiver 105, and indeed by some power being absorbed outside the power receiver 105 (and power transmitter 101). Some of these losses may typically be estimated, such as the loss in the transmitter coil 103 or in the rectifier of the power receiver 105. However, not all power losses can effectively be estimated and there still remain a number of unknown power losses even if no foreign objects are present. These parasitic power losses will introduce a difference between the compensated power levels. Also, the estimation uncertainty for the losses that are estimated will introduce a difference between the actual received and transmitted power levels. Finally, the measurement uncertainty in determining the transmitted and received power levels may introduce an uncertainty which introduces a difference between the transmitted and received power.

Thus, there exists a relationship between the transmitted power and the received power, and thus between a transmitted power indication and the corresponding received power indication. However, in practical implementations, the exact relationship between the transmitted power and the received power is not known as it depends on a number of unknown factors. However, typically an approximate expected relationship can be estimated. For example, an estimate that the transmitted power level is equal to the received power level plus the loss in the transmitter coil 103 plus an additional value can be applied. The additional value may be based on an estimation of the total power loss.

The power transmitter 101 is arranged to generate an expected relationship which indicates the receive power indication that should be received during normal operation when a given transmit power indication is measured and/or which indicates the transmit power indication that should be measured when a given receive power indication is received from the power receiver 105. Thus, an expected relationship (function) is generated which for an input of a received receive power indication provides an expected transmit power indication (i.e. that which would be expected during normal operation) and/or which for an input of a measured transmit power indication provides an expected receive power indication (i.e. that which is expected to be received from the power receiver 105 during normal operation).

Such an expected function may allow deviations to be determined. For example, the function may be considered to reflect the situation where no foreign objects are present, i.e. the expected relationship provides the receive power indication which should be received for a given transmit power indication, or the transmit power indication which should be measured for a given receive power indication, when there are no unusual losses. When a new receive power indication indicating a specific receive power level is received from the power receiver 105, the power transmitter 101 may evaluate the function to determine whether this power level corresponds to a calculated transmit power level in accordance with the expected function.

For example, the function may provide an expected transmit power for a given receive power level, and the received power level may be used as an input. The expected transmit power may for example correspond directly to the transmit power that was measured/calculated during the calibration phase for this received power level. The resulting expected transmit power is then compared to the calculated transmit power. Equivalently, the function may provide an expected receive power for a given transmit power level, and the calculated transmit power level may be used as an input. The resulting expected received power level is then compared to the actual received power level provided from the power receiver 105.

If the comparison reveals a deviation which is too large, this indicates the presence of an unexpected power loss. This may specifically be caused by a foreign object being placed too close or on the power transmitter 101. Such a power loss may result in significant heating of the foreign object which may result in damage or injury. The power transmitter 101 may therefore proceed to terminate the power transfer in such a scenario.

The expected relationship thus provides an expected transmit power indication or an expected receive power indication. If the actual values match the expected values, this is because the expected relationship provides an accurate model of the power transfer. As the expected relationship is determined during calibration where it can be guaranteed that there are no parasitic power losses, the expected relationship models the scenario when there are no parasitic power losses. Therefore, if the actual values match the expected values, the current situation will correspond to the one modeled by the expected relationship, i.e. it will correspond to a situation without any parasitic power losses. In other words, if the actual relationship between the actual transmitted power indication and corresponding actual received power indication is the same (or deviate by less than a given threshold) then there are currently no parasitic losses.

As an example, the expected relationship may be one that provides an expected received power indication as a function of a transmitted power indication. The expected relationship may for example be determined using a function that has e.g. been determined during a calibration phase wherein it was ensured that no foreign objects where nearby.

During the calibration, the power receiver may have set the output power at different levels and for each of the levels a transmitted power indication may have been calculated. For each level, the received power indications from the power receiver 105 may have been recorded and the average value determined. For each power level, the transmitted power indication and the (average) received power indication may then be stored as the expected relationship. Thus, an expected relationship has been determined which for an input of a transmitted power indication provides the received power indication which is expected when there is no parasitic power loss. An expected relationship may be determined for all possible values of the transmitted power indication and the received power indication or for only a subset. In some embodiments, the expected relationship(s) may e.g. be represented by a function which for a values of a transmitted power indication provides a value of the received power indication, or by a function which for a value of a received power indication provides a value of the transmitted power indication.

During normal power transfer, the power transmitter 101 may e.g. calculate a transmitted power indication based on measured values. For at least some of these calculated transmitted power indications, the detector 209 determines what the expected received power indication is, e.g. it may access a look-up-table which provides the average received power indication that was found for that transmitted power indication during the calibration phase. The expected received power indication thus represents the expected relationship between the transmitted power indication and the received power indication for this value of the transmitted power indication.

The detector 209 then analyses the actual received power indication which was received from the power receiver 105. If the relationship between the actual transmitted power indication and the actual received power indication is the same as the relationship between the actual transmitted power indication and the expected received power indication (i.e. the expected relationship), then this reflects that the expected relationship provides a good model for the actual scenario currently experienced. As the expected relationship is determined for a scenario with no parasitic losses, an actual relationship that matches the expected relationship indicates that there are currently no parasitic losses. Conversely, if the two relationships do not match, it indicates that there are currently parasitic losses.

The match between the expected and actual relationships can simply be determined by comparing the determined expected received power indication to the actual received power indication. If these differ by less than a given threshold, this indicates that the actual and expected relationships are sufficiently close for a consideration of there not being any parasitic losses. Otherwise, the detector 209 determines that parasitic losses are currently present.

In other embodiments, the comparison of the expected relationship to the actual relationship may be assessed by considering an actual received power indication and then determining the expected transmitted power indication corresponding to this value. The comparison can then be made by comparing this expected transmitted power indication to the actual calculated transmitted power indication. If they are sufficiently close (difference less than a threshold), then the difference between the expected relationship and the actual function relationship is sufficiently close for the detector 209 to determine that there are no parasitic power losses. Otherwise, the detector 209 determines that parasitic losses are currently present.

Thus, in some embodiments, the detector 209 may determine that parasitic losses are present if the expected transmitted power indication deviates from the actual transmitted power indication by more than a threshold. In some embodiments, the detector 209 may determine that parasitic losses are present if the expected received power indication deviates from the actual received power indication by more than a threshold.

It will be appreciated that both the approach of comparing the expected and actual received power indications for a given transmitted power indication and the approach of comparing the expected and actual transmitted power indications for a given received power indication (or both) inherently corresponds to a comparison of the expected relationship between a transmitted power indication and a received power indication and the actual relationship between these.

However, in order to be able to detect sufficiently small deviations, the expected function must be sufficiently accurate. Since the maximum power that is acceptable to be unaccounted for (and thus possibly being dissipated into foreign objects) is a constant value (of typically around, say, 250 mW-500 mW), the accuracy of the expected function becomes significantly more critical at higher power levels than at lower. E.g. for a transmitted power of 1 W, the uncertainty may be up to perhaps 25% whereas for a 50 W transmitted power, the required accuracy is 0.5% for the same detection performance.

The unknown factors of the relationship between the transmitted and received power fall into different categories. Some factors will be constant and depend on characteristics of the power transmitter 101 and power receiver 105. Such factors include power dissipation in the cabinets of the devices, any constant bias in the measurement operations etc. Other factors may be random and varying, such as measurement noise.

In the system of FIG. 1, a power loss calibration may be performed for the pairing of the power transmitter 101 and the power receiver 105. This power loss calibration may determine the expected relationship, and may specifically introduce a compensation or adaptation to an existing or predetermined expected function such that this more accurately reflect the relationship between the transmitted and received power. In particular, such calibration may compensate for the first category of unknown factors. For example, a calibration may reflect the bias in measurements, the power losses in various circuits of the power transmitter 101 and power receiver 105 etc. Thus, if a power loss calibration has been performed and the expected relationship has been adapted accordingly, a significantly more accurate result can be achieved. Indeed, typically, the power loss calibration can reduce the uncertainty from, say ±5% to around ±0.5%. Such an improvement may allow the system to be used at substantially higher power levels while allowing the same accuracy of the detection of any unaccounted power losses.

Therefore, it is often advantageous to perform a power loss calibration and adapt the expected relationship to be more accurate. However, the power loss calibration is an additional operation which may be considered inconvenient and cumbersome by many users. Therefore, it is highly desirable to reduce the number of power loss calibrations needed.

Accordingly, the system of FIGS. 1 and 2 is arranged to adapt the operation of the system such that the number of power loss calibrations can be minimized while still allowing high power operation.

In the system, the calibration controller 203 determines whether a power loss calibration has been performed for the specific pairing of the power transmitter and power receiver. It is noted that the calibration is not merely a calibration for the power transmitter 103 or a calibration for the power receiver 105. Rather, it is a calibration which is for the specific pairing of the power transmitter and the power receiver, and specifically provides an expected relationship for this specific pair/combination of power transmitter and power receiver.

The calibration controller 203 is coupled to a limiter 205 which is fed an indication of whether power loss calibration has been performed. The limiter 205 is further coupled to the power signal generator 201 and can provide a control input that restricts the power that can be provided, and which specifically may restrict the maximum coil current.

The limiter 205 is arranged to restrict the power to the transmitter coil 103 unless a power loss calibration has been performed for the power transmitter and power receiver pairing. Thus, if no power loss calibration has been performed, the power (and in many embodiments specifically the apparent power or inductor/coil current) is restricted to be below a (possibly adaptable) threshold. The threshold is typically selected to ensure that the unaccounted for power loss which can be detected using a default un-adapted expected relationship is sufficiently low to ensure safe operation. However, if a power loss calibration has been performed for the pairing, the expected relationship has been adapted to be significantly more accurate. Accordingly, the detection performance for unaccounted power losses is significantly improved, and therefore the limiter 205 allows power above the threshold.

The system may thus allow safe operation at high power levels (e.g. up to 50 W or 100 W) while allowing calibration free operation for low power levels (e.g. up to 5 W). Thus, a more convenient user experience is provided while at the same time enabling safe high power level power transfers.

The limiter 205 may for example restrict the current by providing a control signal to the power signal generator 201 indicating a maximum coil current. As another example, the limiter 205 may include a current limiter in the connection from the power signal generator 201 to the transmitter coil 103. As another example the limiter 205 may include a current limiter for the input current of the power signal generator.

The restricting of power may specifically be by restricting the inductor/coil current. Such an approach may be particularly suitable for embodiments or scenarios wherein the inductor voltage is kept substantially constant. This may be the case in many embodiments by keeping a rail voltage (supply voltage) to the drive circuit (and specifically to an inverter) constant during operation. However, the inductor current may also be a useful safety parameter to control even when the inductor voltage varies since the inductor current also depends on the inductor voltage.

Another example of a power that may be restricted is the apparent power which may be given as the product of the RMS voltage and RMS current for the inductor, or equivalently as the square roots of the sums of the squared real power and reactive power.

The power transmitter 101 of FIG. 2 further comprises functionality for detecting parasitic power consumptions, such as typically parasitic power consumption by a foreign object. A parasitic power consumption is a power consumption that is not associated with the power receiver 105, and which may typically be associated with foreign objects that may be placed close to the transmitter coil 103, such as e.g. keys, rings or coins positioned on the power transmitter 101.

The power transmitter 101 comprises a receiver 207 which is arranged to receive messages from the power receiver 105. The messages are provided by load modulation as will be known to the skilled person.

The receiver 207 may specifically receive received power indications from the power receiver 105. The received power indications provide an indication of the power consumed by the power receiver 105. In some embodiments, the received power indications may include some consideration of power losses in the power receiver 105.

The receiver 207 is coupled to a detector 209 which is arranged to detect parasitic power consumption. Particularly the detector 209 is arranged to detect if parasitic power consumption exceeds a given threshold. The detector 209 does this by determining the deviation between the actual relationship between the transmitted power indication and the received power indication and the expected relationship between these values. Thus, if there is no parasitic power consumption, the actual relationship between the received power indication and the transmitted power indication is likely to be almost the same as the expected relationship, i.e. as the expected relationship reflects/models the power transfer situation where there are no parasitic power losses, the actual relationship will match this expected relationship when indeed there are no parasitic power losses present. However, if there is a substantial parasitic power consumption, this will not be reflected in the expected relationship (as this is determined during the calibration phase when it can be guaranteed that there are no parasitic power losses) but will be reflected in the actual relationship. Therefore, the deviation between these will be relatively large thereby allowing the parasitic power consumption to be detected from this deviation. In other words, in a scenario that does not resemble the calibration scenario when no parasitic power losses exist, the expected relationship will be a poor model for the actual operation, and therefore will provide expected values that deviate substantially from the actual values.

In some embodiments, deviations may be detected by comparing values of receive power indications (i.e. between expected and actual values). In some embodiments, deviations may be detected by comparing values of transmit power indications (i.e. between expected and actual values).

For example, the deviation may be detected by deriving the expected transmitted power indication from the received power indication provided by the power receiver 105 and comparing this to the actual calculated transmitted power indication. Alternatively or additionally, the expected received power indication may be derived from actual calculated transmitted power indication and the result may be compared to the actual received power indication provided by the power receiver 105.

Thus, the detector 209 detects whether the parasitic power consumption which is not reflected in the expected relationship is so high that it causes a deviation relative to the actual relationship to exceed a threshold.

When the power transmitter 101 and power receiver 105 pairing has been calibrated, the expected relationship will be a calibrated or adapted expected relationship, i.e. it will reflect the specific characteristics of the specific pairing of the power transmitter 101 and power receiver 105. Thus, it will not merely provide generic expected values (of the receive power indications or of the transmit power indications) but will provide values that are expected for that specific power transmitter 101 and power receiver 105.

Thus, the expected relationship can reflect specific characteristics of the individual devices, such as e.g. characteristics dependent on component variations. Accordingly, the detection will be accurate at higher power levels, thereby allowing a detection of even relatively small parasitic power consumptions.

The detection of a parasitic power consumption above a threshold may be caused by the presence of a foreign object. Therefore, the detector 209 is arranged to provide a control signal to the power signal generator 201 which causes the power transfer operation to be terminated. The approach may accordingly prevent unacceptable heating of foreign objects and provide a safe operation.

The power transmitter 101 of FIG. 2 comprises a calibrator 211 which is capable of performing a power loss calibration for the power transmitter 101 and power receiver 105 pairing. The calibrator 211 can thus perform a power loss calibration in order to determine the expected relationship between received power indications and transmitted power indications. The calibration may generate an improved expected relationship by modifying a default or nominal expected relationship or may directly generate a new expected relationship specific for the pairing. The calibration, i.e. the determination (or adaptation) of the expected relationship can be performed such that it can be assumed with sufficiently high certainty that it reflects a scenario without parasitic power losses. This may for example be done by using a dedicated calibration operation where the user is requested to ensure that there are no foreign objects in the vicinity. Alternatively or additionally, it may be be achieved by performing the calibration over a long time interval in which it can be assumed that for most of the time there are no parasitic power losses. This may e.g. be combined with more complex calibration procedures that e.g. may ignore values when the differences between calculated transmit power and reported receive power exceeds a given level.

Thus, the calibrator 211 may determine specific values that are then used to adapt the relationship or may equivalently directly determine the expected relationship. For example, in some embodiments the calibrator 211 may determine an additional value that should be added to a default or nominal expected relationship. Such an additional value may for example represent the power consumption which is unaccounted for in the nominal expected relationship.

As another example, the calibrator may determine coefficients or other parameters of a function that represents the expected relationship. The coefficients may either be determined outright, or a modification value to nominal coefficients may be applied. For example, a nominal function may be stored which is considered to represent a typical expected relationship between reported received power indications and calculated transmitted power indications. A number of associated measurements may be made during the calibration process and a curve fitting may be performed between the expected relationship and the obtained data sets. Thus, the nominal parameters may be modified until a function is provided which has a sufficient close fit to the measured values. These parameters may then be used to define the adapted expected relationship.

Equivalently, the calibrator 211 may provide a specific expected relationship to use. For example, a number of measurements may be made to provide sample points relating the received power indication to the transmitted power incitation for a number of different values of the received power indication/transmitted power indication. A look-uptable may be generated directly based on these measurements such that for a given, say, received power indication the look-up-table will store the corresponding transmitted power indication obtained from the measurements. In some embodiments, the measurement points may be used directly, i.e. the obtained pairs of received power indication and transmitted power indication may directly be stored in the look-up-table. However, typically some averaging, filtering or smoothing will be applied. It will also be appreciated that interpolation may be used for received power indications/transmitted power indications that do not directly correspond to the stored values.

The calibrator 211 is in the example of FIG. 2 arranged to perform the power loss calibration based on the reported received power indication values, i.e. it is based on measurements and data which may be generated during normal operation. In other embodiments, the calibrator 211 may alternatively or additionally be arranged to perform a dedicated calibration which e.g. is based on measurements, messaging or operations which are not normal operations of a power transfer operation.

In the example of FIG. 2, the calibrator 211 receives a number of received power indications from the power receiver 105. It also determines a number of transmitted power indications for the power transmitter 101. The values may then be averaged over a time window to provide more reliable estimates. The time windows are synchronized between the power transmitter 101 and the power receiver 105 such that corresponding values are generated. The resulting pair of an averaged received power indication and an averaged transmitted power indication provides a data point for the expected relationship. The expected relationship is accordingly adapted such that it provides a relationship which provides as close an approximation to the data point as can be achieved.

Typically, the calibrator 211 will generate a plurality of data points corresponding to different power levels. Thus, after generating a data point, the power receiver 105 may change the loading and the power transmitter 101 may change the transmitted power accordingly. This change of power level may be achieved using messaging and control operations defined for normal power transfer operation. When the new power level has been setup, the calibrator 211 proceeds to repeat the measurement process to generate a new data point with a measured transmitted power indication and corresponding received power indication.

The calibrator 211 may then proceed to generate the adapted or calibrated expected relationship, e.g. by varying parameters of a nominal function relating the received power indication to a corresponding transmitted power indication. Specifically, curve fitting algorithms may be used. As another example, the data points may be stored in a look-up-table with values for other power levels being generated by interpolation.

The calibrator 211 may also restrict the calibration to data points at higher power levels to generate an expected relationship. Since the deviation between transmitted and received power could be expected to be largest at high power levels, the calibrator 211 may accordingly be able to establish an accurate relationship for the most relevant power levels. A deviation at low power levels may already be sufficiently low to not require any specific (pairing) calibration. Alternatively the calibrator 211 can extrapolate the relationship of the higher power levels to lower power levels, e.g. by proportional adaptation of the function that calculates the transmitted power from the measured parameters.

Following the calibration, the expected relationship accordingly closely reflects the relationship between a received power indication and a transmitted power indication for this specific power transmitter 101 and power receiver 105, i.e. for the specific pairing of this power transmitter 101 and power receiver 105. The expected relationship furthermore reflects this relationship when there are no parasitic power losses. Accordingly, an accurate parasitic power loss evaluation can be carried out thereby allowing safe operation at higher power levels.

As previously mentioned, the power loss calibration can be performed under the assumption that there are no parasitic losses associated with foreign objects. In order to ensure this, the calibrator 211 is arranged to request a user input. The user input is taken as a confirmation that the required calibration scenario is in place, and specifically that there are no foreign objects near the power transmitter 101. The calibrator 211 is arranged to only proceed to perform the power loss calibration when such a user confirmation input has been received. Thus, it is assured that no power is absorbed by in particular metal objects during the calibration phase, and that accordingly the difference between the transmitted power and received power is only due to the power transmitter 101 and the power receiver 105 and therefore should be included in the calibration.

As a more specific example, before initiating the calibration phase wherein the power loss calibration is performed, the power transmitter 101 can evaluate one or more conditions to ensure that the received power values are suitable for calibration. The following conditions may e.g. be applied:

Condition 1:

It may be required that the user has been instructed to prevent the presence of any foreign (in particular metal) objects near the interface surface of the power transmitter. Instructions may e.g. be provided on a user interface, such as a display, of the power transmitter 101. Instructions may also be provided in a user manual for the power transmitter 101. The power transmitter may e.g. in such examples provide an indication requiring the user to read the instructions in the manual.

Condition 2:

A user response may be required in response to the indication by the power transmitter 101. The power transmitter 101 may indicate to the user that a calibration should be performed, e.g. by a visual indication being switched on, or the desire to perform a calibration being indicated on a display. In response, it may be requested that the user provides an active user input, e.g. by pressing a suitable button. The indication of the desire to perform calibration can thus be regarded as a request for the user to ensure that no foreign/metal objects are positioned near the surface of the power transmitter 101. The confirmation input provided by the user can be regarded as a confirmation by the user that no foreign/metal objects are present near the surface of the power transmitter.

Condition 3:

It may be required that the user has set the power transmitter 101 into a calibration mode. In some embodiments, the user interface of the power transmitter 101 may provide means for entering the power transmitter into a calibration mode (or to exit the power transmitter 101 from such a mode). If the user sets the power transmitter 101 into a calibration mode, it is assumed that the user has performed the required safety procedures and has not positioned any foreign/metal objects near the surface of the power transmitter.

In some embodiments, the power receiver 105 may also be capable of entering a power loss calibration mode, e.g. to allow it to perform the calibration for different power receiver loads. In such cases, the power transmitter 101 may await confirmation that the power receiver 105 is in the calibration mode before the power loss calibration is initiated. The confirmation may e.g. be provided by a user input or may e.g. be provided by the power receiver 105 communicating a message by load modulation of the power signal where the message indicates that the power receiver 105 has entered the calibration mode.

In some embodiments, a new power receiver 105 may be positioned close to the power transmitter 101 in order for a power transfer to begin. If the requested power by the power receiver 105 is sufficiently low, i.e. lower than the threshold used by the limiter 205, the power transmitter 101 may proceed to directly provide the power to the power receiver 105 without any calibration being required. However, since no calibration has been performed, the limiter 205 restricts the coil current to the transmitter coil 103, and power levels above the level corresponding to this maximum current is not supported by the power transmitter 101. However, if the power receiver 105 requests such a higher power, the power transmitter 101 proceeds to initiate a calibration phase wherein a power loss calibration is performed. The phase may be initiated by requesting a user input confirming that no foreign objects are present and that the calibration should go ahead. When the confirmation is received, the calibrator 211 proceeds to perform the calibration and generates a number of data points of corresponding receive power indications and transmitted power indications for the specific power transmitter 101 and power receiver 105 pairing. It then proceeds to adapt the expected relationship to match these data points. Following the calibration, the power transmitter 101 proceeds to support the higher power level while continuously monitoring for unacceptable parasitic power losses. If such a power loss is detected, the power transfer phase is terminated.

Thus, the approach may provide safe and user friendly operation with calibrations reduced to only be performed when required to support higher power levels.

In many embodiments, the power transmitter 101 may further reduce the number of calibrations that are performed and may indeed restrict the calibrations to only be performed if high power is required and the power receiver 105 has not previously been used with the power transmitter 101.

An example of such a power transmitter 101 is illustrated in FIG. 3. The power transmitter 101 corresponds to that of FIG. 2 except that it further includes a calibration memory 501 coupled to the calibrator controller 203.

In the example of FIG. 3, the calibrator controller 203 is arranged to store the calibration data in the calibration memory 501 after a calibration has been performed. Thus, once a power loss calibration has been performed by the calibrator 211, the resulting calibration values are fed to the calibrator controller 203 which stores them in the calibration memory 501. In addition, an identity of the power receiver 105 for which the calibration has been performed is stored.

The identity of the power receiver 105 is determined in response to a message which is transmitted from the power receiver 105 by load modulation. Power transfer systems such as Qi comprise provisions for the power receiver 105 communication an identity (e.g. a unique identity number) to the power transmitter 101. In particular, in Qi the identity of the power receiver 105 is provided to the power transmitter 101 as part of the Identification and Configuration phase. Thus, the calibrator controller 203 may extract this identity and store it together with the compensation values that are determined during calibration.

It will be appreciated that the stored calibration values may e.g. be offset values, coefficients or other parameters of a function describing the expected relationship. Equivalently, the compensation values may directly be the adapted expected relationship. For example, the calibrator controller 203 may directly store corresponding values for received power indications and transmitted power indications. Specifically, the calibrator controller 203 may store compensation values that define a look-up-table.

In the embodiment of FIG. 3, when a new power receiver 105 is detected, the calibrator controller 203 proceeds to determine whether power loss calibration has been performed for this power transmitter and power receiver pairing based on the identity of the power receiver 105 and the identities which are stored in the calibration memory 501.

Specifically, if there is a match between the identity provided by the power receiver 105 during the Identification and Configuration phase and one of the identities stored in the calibration memory 501, the specific power transmitter and power receiver pairing has been calibrated previously. Accordingly, the calibrator controller 203 may extract the compensation values and use this data to provide an adapted expected relationship which is specifically adapted to this power transmitter 101 and power receiver 105 pairing.

As a result, a more accurate expected relationship is provided without any need to perform a (new) power loss calibration. The power transfer then proceeds as normal with the limiter 205 allowing power levels above those corresponding to the limiting coil current threshold.

If no match is found in the calibration memory 501, the calibrator controller 203 considers that no power loss calibration has been performed. Accordingly, it proceeds with the power transfer while restricting the maximum coil current to be below the limiting threshold.

If higher power than can be provided by the power transmitter 101 under this restriction is required by the power receiver 105, the calibrator controller 203 proceeds to initiate a power loss calibration as has been previously described. The result of such a calibration is then used to generate a more accurate expected relationship which can be used at the higher power levels. Furthermore, the calibration results are stored in the calibration memory 501 together with the identity of the power receiver 105. The next time the power receiver 105 is used with the power transmitter 101, it may directly be supported at the higher power level without requiring any new calibration to be performed.

It will be appreciated that in some embodiments, criteria may be imposed in order for the stored compensation values to be considered valid. Specifically, it may be required that the time since the last calibration is lower than a given threshold. Thus, when the calibration results are stored, the calibrator controller 203 may also store a time stamp or an expiry time. If the stored compensation data is not valid for the power receiver 105, a new power loss calibration may need to be performed.

In some embodiments, the calibrator 211 may be arranged to perform the calibration in a plurality of subphases or submodes wherein the results of the previous phase(s)/mode(s) is used in the current.

Specifically, the calibrator 211 may first perform a power loss calibration wherein compensation values are performed for a first set or interval of power levels. For example, a calibration may be performed while keeping the power level to be below, e.g. 5 W. At this low power level, a default or nominal expected relationship can be used to detect whether unacceptable unaccounted for power loss is experienced. In particular, even a relatively inaccurate expected relationship may allow the system to detect if the power loss in a foreign object increases beyond, say, 250 mW. Based on this first calibration operation, the calibrator 211 can proceed to adapt the expected relationship to provide a more accurate indication of the relationship between transmitted power indications and received power indications.

The calibrator may then proceed to perform a second power loss calibration operation for a second set or interval of power levels where the second set/interval includes power levels that are higher than for the first calibration operation. For example, a calibration may be performed for power levels up to, say 20 W. During this second calibration operation, the detector 209 continues to monitor for parasitic power losses that are unacceptably high. However, it does this using the expected relationship that resulted from the first calibration operation. Accordingly, although the adaptation was based on data points for power levels below 5 W it very likely provides a more accurate estimate of the relationship between transmitted power indications and received power indications also for higher power levels. Accordingly reliable detection of e.g. foreign objections can be performed at higher power levels, such as up to the 20 W limit. Accordingly, the power level can be increased and compensation values for the higher power levels can be determined. The expected relationship may accordingly be further refined to provide a more accurate estimate at higher power levels.

The calibrator may e.g. continue to perform a third calibration operation, e.g. for power levels up to 50 W. This third calibration operation may utilize the expected relationship resulting from the second calibration.

As a specific example of the operation of the power transmitter 101 of FIG. 3, the calibrator 203 may first check whether the power receiver and power transmitter pairing has been calibrated before. If not the power transmitter 101 enters a first calibration sub mode wherein the output power level is restricted. If it has been calibrated, the power transmitter 101 instead enters a second calibration sub-mode in which higher power levels may be applied. In other embodiments, it may in such cases completely skip the calibration.

In the first calibration sub-mode, the power transmitter 101 limits the power transfer level to a conservative maximum level which allows detection of foreign objects using the nominal expected relationship, i.e. it is considered save even though the power transmitter 101 has no calibration information for the specific power receiver 103.

The accuracy of the reported received power is expected to be within a predefined tolerance range relatively to the real received power.

The power transmitter 101 then follows the standard procedure in order to enter the power transfer mode. While providing power to the power receiver 103, the power transmitter 101 measures the necessary parameters to determine the transmitted power and at the same time it collects the reported received power values. The power transmitter 101 also checks that the difference between transmitted and received power does not exceed a safety threshold, i.e. the detector detects that the deviation from the expected relationship does not exceed a given threshold.

After collecting sufficient received power values, the power transmitter 101 proceeds to generate a calibrated expected relationship. Specifically, the expected relationship may be one that allows the expected received power indication to be calculated from various transmitter parameters related to the transmitted power from the power transmitter 101.

Specifically, the power transmitter 101 can determine a function which allows a received power to be calculated as a function of measured parameters of the power transmitter 101. The function can be regarded as the expected reported received power or as a calibrated transmitted power for this particular power receiver 101. Alternatively, the power transmitter can determine a function which allows the difference between transmitted and received power to be determined as a function of the measured parameters.

The measured parameters of the power transmitter can for example include:
 coil current
 coil voltage
 frequency of the power signal
 inverter current
 dc voltage.

When the first calibration sub-mode has been completed, the calibrator 211 may proceed to the second calibration sub-mode.

In the second calibration sub-mode, the power transmitter 101 does not limit the maximum power transfer level or coil current, but allows a power level up to a maximum power level as indicated by the power receiver 101. The power transmitter 101 can use the received power values for higher power levels to extend the calibration to higher power levels.

In some embodiments, the power transmitter 101 may be arranged to adapt the expected relationship during a power transfer phase.

The power transfer phase adaptation can be based on a comparison of transmitted power indications and received power indications which are determined and received during the normal power transfer phase. Specifically, the same approach as described for the power loss calibration by the calibrator 211 may be used.

However, the adaptation rate during the normal power transfer phase is typically substantially lower than during a calibration. Thus, specifically, a time constant for adapting the compensation value during the power transfer phase may be higher than a time constant for determining the compensation value during the calibration phase. Typically, the difference in the adaptation rate/time constant is at least 2, 5 or even 10 times.

The slower adaptation rate during the power transfer phase reflects that the adaptation can typically be performed over a much longer duration, using more measurement points, the expected relationship is already fairly accurate, and the measurement scenario is less certain than during the calibration phase (e.g. no specific user involvement is included to ensure there are no foreign objects). Thus, the adaptation during the power transfer phase is often used to fine tune or refine the expected relationship.

Thus, during the power transfer phase, the power transmitter 101 can improve the accuracy of the expected relationship using the same approach as during the power loss calibration. Furthermore, as it can be expected that the power transmitter 101 collects many more reported received power values in this mode than in the calibration mode (due to the increased time in which the power transmitter 101 is in this phase) and since the power transmitter cannot trust the reported received power values as much as in the calibration phase, the power transmitter 101 adapts the expected relationship more conservatively than in the calibration mode. E.g. the power transmitter 101 adapts the expected relationship only with marginal changes and only after receiving data over a longer period of time.

Furthermore, in order to avoid that the expected relationship is adapted to reflect e.g. the presence of foreign objects, the expected relationship is not adapted when it is detected that the deviation between the actual relationship between the transmitted power indication and the received power indication and the expected relationship between these exceeds a threshold.

Specifically, if a data point falls outside certain boundaries, the power transmitter 101 ignores the data point when adapting the expected relationship. Moreover if the difference between actual and expected relationships is above a given threshold, the power transmitter 101 will terminate the power transfer. In other words, the detector 209 is operational as previously described.

In some embodiments the power transmitter 101 may not directly proceed to terminate the power transfer phase but may proceed to enter a power loss exceeded mode. In this mode, the power transmitter 101 does not adapt the expected relationship. It may however reduce the power level of the power transfer as it is suspected that a foreign object may absorb power from the magnetic field.

The power transmitter 101 may involve the user e.g. by providing a user alert to indicate a warning. It may e.g. ask for a confirmation that no foreign objects are near to the interface surface of the power transmitter 101 and use such a confirmation to return to normal mode.

The power transmitter 101 may also return to normal mode if further received power values lead to a power loss which no longer exceeds the threshold.

If the power loss continues to exceed the threshold, the power transmitter 101 changes from power loss exceeding mode to an error mode and terminates the power transfer.

The power transmitter 101 of FIG. 3 may specifically adapt an expected relationship which allows the estimation of the transmitted power from a received power values provided by the power receiver 105.

After collecting sufficient data/received power values, the power transmitter 101 can store the parameters that are necessary for calculating the transmitted power for this particular power receiver 103. The parameters are stored at a location in the calibration memory 501 which can be accessed using the identifier of the power receiver 105.

This approach can be applied in the calibration mode, but also in the normal power transfer mode. The difference between these two modes can be made by applying a relatively large adaptation factor and using a limited amount of received power values in the calibration mode thereby reducing the calibration time. A relatively small adaptation factor and a large amount of received power values can be used in the normal power transfer mode when adapting the parameters for calculating the transmitted power.

The following adaptation process may for example be performed for each received power value.

The power transmitter 101 may first measure the coil current and input power of the transmit coil 103 and accordingly estimate the power loss in the transmit coil 103 according to a default function.

This power loss function could for example be the following.

$$P_{loss} = R \cdot I_{coil}^2$$

where
$I_{coil}$ is coil current in the transmit coil 103,
$P_{loss}$ is the estimated power loss in the power transmitter 101,
R represents the equivalent resistance for calculating the power loss as function of $I_{coil}$
R may depend on the frequency of the transmitter coil current, e.g. according to a function such as:

$$R = R_b + R_f \cdot f, \text{ where}$$

$R_b$ is the frequency independent part of the equivalent resistance,
$R_f$ is the frequency dependent part of the equivalent resistance, and
f is the frequency.

Samples of these (three) parameters are then stored in memory, e.g. every millisecond.

At the reception of a received power message from the power receiver 105, the power transmitter 101 may proceed to:
average the samples of the primary coil current to generate $I_{coilavg}$
average the samples of the input power to the primary coil to generate $P_{inavg}$
average the samples of the power loss in the transmit coil to generate $P_{lossavg}$ The averaging is applied over the time window that is indicated by the power receiver 105 to have been used when the power receiver 105 determined the reported received power.

It is assumed that the power transmitter has not changed the frequency in the time window.

The difference ($P_{Diff}$) between the calculated averaged transmitted power ($P_{PT}$) and the reported received power ($P_{PR}$) is then determined as:

$$P_{Diff} = P_{PT} - P_{PR}, \text{ where}$$

$P_{PT}$ is determined as $P_{inavg} - P_{lossavg}$; where
$P_{inavg}$ is the average input to primary coil,
$P_{lossavg}$ is the average power loss in transmitter coil,
$P_{lossavg}$ is determined as $R \cdot I_{coilavg}^2$; where
$I_{coilavg}$ is the average transmitter coil current.

The value $P_{Diff}$ accordingly represents a difference between the transmit power and the received power provided from the power receiver 105. It also represents a deviation of the actual relationship between the transmitted power and the received power from the expected relationship, since in this case the expected relationship is that $P_{PT} - P_{PR}$ should be zero, i.e. that $P_{PT}$—as calculated above should be equal to the reported received power $P_{PR}$.

The value $P_{Diff}$ can thus directly be used as an indication of the parasitic power loss that is unaccounted for in the expected relationship. Thus, $P_{Diff}$ can directly be used by the detector 209 to estimate whether a foreign object is present.

Furthermore, the power transmitter 101 can proceed to adapt the expected relationship. Specifically, the expected relationship is represented by (amongst others) the parameter of the frequency independent part of the equivalent resistance.

The power transmitter may adapt this parameter and calculate a new frequency independent part of the equivalent resistance ($R_{bnew}$) such that after recalculating the transmitted power according to the above explanation, the difference between transmitted and received power shifts towards a value that is close to zero.

In many cases it may be desirable to have a bias for the deviation, and the difference between transmitted and received power shifts may therefore be shifted towards a value that is in the middle between two values: $P_{DiffMin}$ and $P_{DiffMax}$.

These limits are for example:

$P_{DiffMin} = -300$ mW, $P_{DiffMax} = 50$ mW.

The power transmitter accordingly adapts the parameter $R_{bnew}$ to result in a calculation closer to $P_{Diff} = -125$ mW.

E.g., the power transmitter may derive the new frequency independent part of the equivalent resistance ($R_{bnew}$) as follows.

$P_{PTnew} = P_{PTold} + \text{adapt-factor} \cdot (P_{PR} - 125 \text{ mW} - P_{PTold})$, with $P_{PTnew}$ being the new estimated transmitted power, $P_{PTold}$ being the old estimated transmitted power, and adaptfactor being a scalar value that controls the speed of the adaptation.

Furthermore $P_{PTnew} = P_{inavg} - P_{lossnew}$; where $P_{lossnew} = R_{new} \cdot I_{coilavg}^2$; with $R_{new} = R_{bnew} + R_f$ This leads to an adaptation of the parameter $R_{bnew}$ according to the following equation:

$R_{bnew} = (P_{inavg} - (P_{PTold} + \text{adaptfactor} \cdot (P_{PR} - 125 \text{ mW} - P_{PTold}))) / I_{coilavg}^2 - R_f$ The previous description has focused on the implementation of functions in the power transmitter 101. However, it will be appreciated that in some embodiments, the detection of parasitic power consumption may be performed in the power receiver 105. For example, the power receiver 105 may comprise a memory which stores calibration values for different power transmitters. If a power transfer configuration is detected to be performed with a power transmitter 101 for which the power receiver 105 has calibration data, it may proceed to request a power level that may be relatively high. However, if no calibration data is contained in the memory, the power receiver 105 proceeds to restrict the power requests to power levels that allow safe operation with respect to e.g. potential foreign objects.

For example, a power receiver 105 may power two different loads or may be able to operate in two different modes. For example it may operate in a slow charging mode thereby limiting the charging current to the battery to e.g. 1A, or it may operate in a fast charging mode thereby allowing a charging current to the battery of e.g. 2A or more. As another example, it may be able to operate in a charging mode where it charges a battery for a device or in a full operation mode where it provides sufficient power to the device to operate without drawing current from the battery. If the power receiver 105 detects that the power transmitter 101 corresponds to a calibration pairing stored in the memory, it may proceed to request sufficient power for both loads or to support both operational modes. However, if there is no calibration data for power transmitter 101, it may proceed to only request sufficient power for one load or for the less power demanding mode. For example, it may allow only a slow charging of the battery and not fast charging or full operation of the device.

Also, in some embodiments, the detection of whether the current relationship between transmit power indications and receive power indications match the expected relationship may be performed in the power receiver 105. Specifically, the power transmitter 101 may communicate the current calculated transmit power to the power receiver 105 which may on the basis of a determined receive power indication and the calibration data proceed to determine whether the current calculated transmit power corresponds to the expected transmit power. It will be appreciated that most of the principles and approaches of the previous description may equivalently be used in the power receiver 105.

It will be appreciated that the above description for clarity has described embodiments of the invention with reference to different functional circuits, units and processors. However, it will be apparent that any suitable distribution of functionality between different functional circuits, units or processors may be used without detracting from the invention. For example, functionality illustrated to be performed by separate processors or controllers may be performed by the same processor or controllers. Hence, references to specific functional units or circuits are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units, circuits and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements, circuits or method steps may be implemented by e.g. a single circuit, unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to "a", "an", "first", "second" etc. do not preclude a plurality. Reference signs in the claims are provided merely as a clarifying example shall not be construed as limiting the scope of the claims in any way.

The invention claimed is:

1. A power transmitter for transferring power to a power receiver using a wireless inductive power signal, the power transmitter comprising:

an inductor for providing the power signal;

a power signal generator for driving the inductor to provide the power signal;

a calibration controller for determining whether a power loss calibration has been performed for the power transmitter and power receiver pairing, the power loss calibration determining an expected relationship between a received power indication provided by the power receiver and a transmitted power indication for the power transmitter;

a power limiter arranged to restrict a power provided to the inductor based on a power loss calibration;

a receiver for receiving the received power indications from the power receiver; and a detector for detecting a parasitic power consumption based on a deviation between an actual relationship and the expected relationship.

2. The power transmitter of claim 1, wherein the power limiter restricts the power to the inductor when the power loss calibration has not been performed for the power transmitter and power receiver pairing.

3. The power transmitter of claim 2, wherein the power limiter restricts the power to the inductor when a threshold is exceeded.

4. The power transmitter of claim 1, wherein the power limiter does not restrict the power to the inductor when a threshold is exceeded if the power loss calibration has been performed for the power transmitter and power receiver pairing.

5. The power transmitter of claim 1, wherein the detector detects the parasitic power consumption when the deviation exceeds a predetermined threshold.

6. A power transfer system comprising a power transmitter and a power receiver, the power transmitter being arranged to transfer power to a power receiver using a wireless inductive power signal, the power transmitter comprising:

an inductor for providing the power signal;

a power signal generator for driving the inductor to provide the power signal;

a calibration controller for determining whether a power loss calibration has been performed for the power transmitter and power receiver pairing, the power loss calibration determining an expected relationship between a received power indication provided by the power receiver and a transmitted power indication for the power transmitter;

a power limiter arranged to restrict a power provided to the inductor based on a power loss calibration;

a receiver for receiving the received power indications from the power receiver; and a detector for detecting a parasitic power consumption based on a deviation between an actual relationship and the expected relationship.

7. The power transfer system of claim 6, wherein the power limiter restricts the power to the inductor when the power loss calibration has not been performed for the power transmitter and power receiver pairing.

8. The power transfer system of claim 7, wherein the power limiter restricts the power to the inductor when a threshold is exceeded.

9. The power transfer system of claim 6, wherein the power limiter does not restrict the power to the inductor when a threshold is exceeded if the power loss calibration has been performed for the power transmitter and power receiver pairing.

10. The power transfer system of claim 6, wherein the detector detects the parasitic power consumption when the deviation exceeds a predetermined threshold.

11. A method of operation for a power transmitter arranged to transfer power to a power receiver using a wireless inductive power signal, the method comprising:

driving an inductor to provide the wireless inductive power signal;

determining whether a power loss calibration has been performed for a power transmitter and power receiver pairing, the power loss calibration determining an expected relationship between a received power indication provided by the power receiver and a transmitted power indication for the power transmitter;

restricting a power provided to the inductor based on a power loss calibration;

receiving the received power indications from the power receiver; and detecting a parasitic power consumption based on a deviation between an actual relationship and the expected relationship.

12. The method of claim 11, wherein the power is restricted to the inductor when the power loss calibration has not been performed for the power transmitter and power receiver pairing.

13. The power transmitter of claim 12, wherein the power is restricted to the inductor when a threshold is exceeded.

14. The method of claim 11, wherein the power is not restricted to the inductor when a threshold is exceeded if the power loss calibration has been performed for the power transmitter and power receiver pairing.

15. The method of claim 11, wherein the parasitic power consumption is detected when the deviation exceeds a predetermined threshold.

* * * * *